(12) United States Patent
Chetlur et al.

(10) Patent No.: US 6,187,665 B1
(45) Date of Patent: Feb. 13, 2001

(54) PROCESS FOR DEUTERIUM PASSIVATION AND HOT CARRIER IMMUNITY

(75) Inventors: Sundar S. Chetlur; Pradip K. Roy; Anthony S. Oates; Sidhartha Sen; Jonathan Z-N. Zhou, all of Orlando, FL (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/378,856

(22) Filed: Aug. 23, 1999

Related U.S. Application Data

(60) Provisional application No. 60/115,881, filed on Jan. 14, 1999.

(51) Int. Cl.$^7$ ................................................. H01L 21/366
(52) U.S. Cl. ................... 438/627; 438/585; 438/643; 438/648; 438/649; 438/795; 438/770; 438/799; 438/787
(58) Field of Search ..................... 438/795, 799, 438/585, 770, 787, 627, 643, 648, 649

(56) References Cited

U.S. PATENT DOCUMENTS

| | | | |
|---|---|---|---|
| 5,972,765 | * 10/1999 | Clark | 438/308 |
| 6,025,280 | * 2/2000 | Brady | 438/762 |

FOREIGN PATENT DOCUMENTS

94/09829 * 9/1994 (WO).

OTHER PUBLICATIONS

Wolf, Stanley, Silicon Processing For The VLSI Era, vol. 2, p 188–189, 147–150, 1990.*

Wolf, Stanley, Silicon Processing for the VLSI Era, vol. 2, pp 188–189, 147–150, 1990.*

Ehrlich, Daniel, Emerging Technologies for In Situ Processing, pp 45–54, 1988.*

Lyding, J.W. "Reduction of hot eletron degradation in metal oxide semiconductor transistors by deuterium processing", Appl. Phys. Lett., 68 (18) Apr. 26, 1996, p2526–2528.*

Ehrlich, Daniel J., "Emerging technologies for In Situ Processing", 1988 Martinus Nijhoff Publishers, p45–54, 1988.*

* cited by examiner

Primary Examiner—Charles Bowers
Assistant Examiner—Lisa Kilday
(74) Attorney, Agent, or Firm—Christie, Parker & Hale, LLP

(57) ABSTRACT

A process sequence for forming a semiconductor device utilizes a passivation annealing process using deuterium which enhances immunity to hot carrier effects and extends device lifetime. The process sequence is carried out prior to the introduction of metal conductive films to the device. The process sequence includes a three-step passivation, de-passivation, re-passivation sequence and utilizes a barrier film to encapsulate deuterium molecules in the vicinity of a gate oxide, during the de-passivation operation.

21 Claims, 2 Drawing Sheets

PROCESS FOR DEUTERIUM PASSIVATION AND HOT CARRIER IMMUNITY

RELATED APPLICATIONS

This application claims priority of U.S. Provisional Application Ser. No. 60/115,881, inventors Sundar S. Chetlur, Pradip K. Roy, Anthony S. Oates, Sidhartha Sen, and Jonathan Z-N. Zhou, entitled A 3-STEP PASSIVATION-DEPASSIVATION-PASSIVATION $D_2$ ANNEALING PROCESS FOR HOT CARRIER IMMUNITY AND TRANSISTOR MATCHING, filed on Jan. 14, 1999.

FIELD OF THE INVENTION

This invention relates to semiconductor integrated circuit devices, most generally, and the processes for forming these devices. More specifically, this invention relates to the processes used to provide a dielectric film structure having trap sites passivated with deuterium and an enhanced immunity to hot carrier aging effects.

BACKGROUND OF THE INVENTION

Semiconductor integrated circuit devices include a thin dielectric film, commonly a thermally grown oxide, which functions as a gate dielectric for transistors which are formed within the semiconductor substrate and incorporated into semiconductor integrated circuit devices. The gate dielectric film is typically formed on the semiconductor substrate over a region within the substrate which will serve as a channel region of a transistor, and beneath a subsequently formed gate electrode. A thin interface region forms the boundary between the gate dielectric film and the substrate surface. The transistors function when the channel region formed in the semiconductor substrate is biased to allow a current to flow from a source region to a drain region by way of the channel region. A gate voltage applied to the gate electrode disposed atop the gate dielectric film provides the necessary bias. When the applied gate voltage exceeds the threshold voltage (V) of the transistor, current flows laterally from the source region to the drain region through the channel region, and the transistor is turned "ON".

The quality and integrity of the gate dielectric film is critical to the functionality of the transistor devices which include a very tightly defined set of operational characteristics which, in turn, are very sensitive to the characteristics of the materials and process operations used to form the transistor devices. It is important, therefore, to maintain the operational characteristics of the gate dielectric film, and specifically, to suppress any changes associated with the fixed electrical charge of a gate dielectric film and the interface region formed between the gate dielectric film and the underlying substrate surface.

A thermally grown oxide film, commonly used as a gate dielectric material in the semiconductor processing industry, carries with it an electrical charge—called a fixed oxide charge. This fixed oxide charge influences the threshold voltage required for turning on a transistor device. If the charge associated with the gate oxide film changes in time, so, too, will the actual threshold voltage which must be applied to turn on the transistor. When the threshold voltage changes in time due to a change in the fixed oxide charge, or when the actual threshold voltage of a manufactured transistor device differs from the targeted threshold voltage due to unanticipated charge characteristics of the oxide film, device functionality is destroyed. Therefore, it is of critical importance to suppress the addition of any trapped electrical charges which alter the operational characteristics, specifically, the charge characteristics of the film.

In the semiconductor manufacturing industry, the gate dielectric film is typically an oxide film thermally grown on a silicon substrate to form a silicon dioxide ($SiO_2$) film, hereinafter referred to as an "oxide" film. Defects such as impurities and dangling or broken bonds within the oxide film form trap sites, or "traps". Traps within a gate oxide film can exist at the gate electrode/oxide interface, the bulk oxide film, or the oxide/substrate interface. Interface traps located at the oxide/substrate interface are especially prevalent. This is so, because, during the formation of the gate oxide film, a transition region forms between the crystalline silicon and the amorphous gate oxide. As a result, the transition region (the oxide/substrate interface) includes many incompletely bonded species which constitute trap sites.

These trap sites are usually uncharged, but can become charged when electrons and holes are introduced into the oxide and become trapped at the trap site. One way that traps become charged is by avalanche injection of highly energetic electrons or holes into the oxide. These highly energetic electrons or holes are commonly called "hot carriers". Trap sites are commonly "passivated" by a passivation species which complexes with, and occupies, the trap sites and makes the sites resistant to being occupied by the hot carriers. Highly energized hot carriers, however, can displace or "knock out" the passivation species from the trap site.

Hot carriers develop and become injected into trap sites existing in oxide films as a result of at least three effects: i) subsequent processing operations such as plasma processes can produce hot carriers, ii) the oxide film is exposed to radiation environments which produce hot carriers, and iii) during device operation, the electric field created by applying voltages to the device can create hot carriers.

Several processing operations commonly used in the fabrication of semiconductor devices produce radiation environments which result in radiation damage to the oxide film as above. Among such commonly used processing operations are included: e-beam evaporation; sputtering; plasma-enhanced chemical vapor deposition (PECVD); plasma etching; ion implantation; and direct write e-beam and x-ray lithography. It can be seen that these processing operations result in the production of hot carriers which become trapped in unoccupied trap sites or which replace passivation species from occupied trap sites and which add a trapped charge to the dielectric film. The trapped charge contributes to the fixed oxide charge and changes the operating characteristics, specifically the threshold voltage (i.e. the voltage necessary to turn "on" a transistor), of a semiconductor integrated circuit device.

Additionally, hot carriers may be injected into unoccupied or passivated trap sites within the oxide or interface region after complete formation of the semiconductor device. This can occur due to the semiconductor device being operated in a radiation environment, or from highly energetic particles such as gamma-rays from space, which can enter the oxide and become trapped at the trap sites. More commonly, hot carrier injection occurs during device operation due to the electric field created as a result of voltages being applied to a device during operation. When this occurs in time and gradually degrades the device and decreases the lifetime of the device by changing the operational characteristics in time, it is known as hot carrier aging.

The conventional method for making a semiconductor device immune to hot carrier effects, is to "passivate" the trapped sites within the oxide film. Alternatively stated, the lifetime of a device (the time before hot carrier degradation destroys device performance), can be increased by minimizing and/or reducing the number of trap sites in the gate oxide by passivating them. In essence, this reduces the density of unoccupied trap sites available which injected hot carriers may occupy. The trap sites may be passivated by annealing in a passivating species such as hydrogen, at relatively high temperatures. The hydrogen diffuses into the oxide film and occupies the trap sites by complexing with the dangling bonds or impurities which form the trap site.

Occupied by a passivating species such as hydrogen, the trap sites are no longer open to trap charged hot carriers. Energized hot carriers, however, can displace or "knock out" a passivating species from a passivated, or occupied, site. The energized hot carriers are often produced during device operation as a result of the voltages applied to the device. Most commonly, during device operation, energized hot carriers travel laterally from the source or drain regions of a transistor and into the oxide/substrate interface in the channel region, thereby knocking out a passivating species from a passivated trap site. This can destroy device performance. As such, it is desirable to passivate trap sites with a passivating species which is resistant to being displaced by a hot carrier.

It has been found recently that deuterium ($D_2$) is a passivating species which is far superior to hydrogen ($H_2$). Deuterium has been found to be more effective in occupying, and remaining in, trap sites within an oxide film, thereby more effectively preventing hot carriers from becoming trapped at the trap sites and increasing the fixed oxide charge. Deuterium enjoys this advantage, in part because of its relatively large molecular size compared to hydrogen. Once deuterium has been introduced to a trap site thereby passivating the site, it is less susceptible to being "knocked out" by subsequently formed, energized hot carriers. In this manner, deuterium increases device immunity to hot carrier effects and extends the lifetime of a device. Deuterium has been known to improve the lifetime of a device by an order of magnitude with respect to hydrogen.

Using conventional processing techniques, passivation annealing typically occurs at a temperature in excess of 800° C. This high temperature accelerates the diffusion of the passivating species throughout the device and allows for maximum passivation of trapped sites by the passivating species. After metal films which will form the metal wiring pattern, have been added to the device, however, annealing at temperatures exceeding 400°–450° C. is not practical. The aluminum alloys and copper alloys commonly used as metal films, melt at temperatures greater than about 400°–450° C., depending on the specific composition of the alloy used. A shortcoming of the conventional processing sequence used to fabricate a semiconductor device, is that several processing operations are performed on the semiconductor device subsequent to the addition of the metal film. Many of the subsequent operations such as plasma-enhanced CVD, reactive ion etching, and sputter deposition used to form the metal film, produce hot carriers and cause these hot carriers to be trapped within the trap sites either by occupying available trap sites or by knocking out a passivation species which is occupying the trap site. For the foregoing reasons, it is especially important to passivate as many traps as possible prior to the introduction of the metal film, in order to prevent hot carrier injection into the traps during the metal deposition process and processes subsequent to the introduction of the metal film. It is also important to passivate the trap sites with a species which is resistant to being displaced by a subsequently energized hot carrier, such as produced during device operation.

An additional passivation anneal process is generally carried out after the complete fabrication of the device because of the following considerations: previously passivated trap sites may become "de-passivated" when subsequent high temperature processes urge the diffusion of the passivation species away from passivated trap sites; previously passivated trap sites may become de-passivated by an energized hot carrier created during subsequent processing operations (as above), and because it is desirable to maximize the number of sites passivated because hot carriers may form as a result of device operation and because hot carriers are present in space and in the working environment of the functional semiconductor device.

When the passivation anneal process is carried out after device fabrication is completed and after the addition of metal films to the device, it must necessarily be carried out at a temperature no greater than 400°–450° C. Since it is necessary to ensure that all trap sites, including oxide trap sites within a gate oxide film disposed under several layers of superjacent films, must also be passivated, it can be seen that the passivation anneal process carried out at a low temperature takes a considerable amount of time. This is especially true for deuterium. The extended time is necessary to allow for the diffusion of the passivating species from the atmosphere above the substrate, through several superjacent layers, and down to the gate oxide film. While higher passivation anneal temperatures may allow for a shorter passivation anneal time, temperatures greater than 400–450° C. create other device defects. As such, this is a time consuming process, and it is desirable to completely and permanently passivate as many sites as possible prior to a post-processing passivation operation.

It can be seen that a passivation anneal process which uses a superior passivating agent—deuterium, which effectively passivates a maximum number of trap sites and which is less likely to be displaced by thermal processing or by a subsequently formed hot carrier, and which further reduces process time for the post-passivation anneal, is needed in the art. Furthermore, a structure having permanently passivated trap sites resistant to being displaced by the above methods, is also needed in the art.

SUMMARY OF THE INVENTION

The present invention addresses the shortcomings of the conventional art by providing a process sequence for deuterium passivation of trap sites in a dielectric film which increases device immunity to hot carrier effects and resistance to hot carrier aging. The process sequence of the present invention is performed during the sequence of formation of a semiconductor integrated circuit device, and before a metal film is introduced onto the device. The present invention includes a process is sequence which includes an operation for passivating oxide trap sites with deuterium, and a barrier film formation step which encapsulates the deuterium beneath the impervious barrier material. With the deuterium encapsulated beneath an impervious barrier material, the produced structure is resistant to having trap sites subsequently charged by hot carriers. The deuterium is maintained within the region of the trap sites, and is not lost through diffusion during high temperature processing steps because it is encapsulated beneath the barrier material.

DETAILED DESCRIPTION OF THE INVENTION

The present invention provides a structure produced by an annealing sequence which effectively passivates trap sites in a dielectric film with deuterium. The processing sequence of the present invention occurs prior to the formation of metal films which will be formed into metal wiring patterns used in semiconductor integrated circuit devices. The process sequence of the present invention also utilizes a barrier material formed as a barrier film, and which is impervious to deuterium diffusion. The process sequence of the present invention also occurs sequentially following a high temperature source/drain anneal commonly performed upon integrated circuit devices. The present invention is not limited, however, to specific device structures. Further, the present invention is not intended to be used in conjunction with a specific barrier material, or at a specific processing point in the production of a semiconductor integrated circuit device. Furthermore, the present invention is not intended to be directed or limited to a particular device formed on a semiconductor substrate. Rather, the present invention is directed to passivating any device having a dielectric film which includes trap sites, including semiconductor integrated circuits formed using 0.25 micron processing technology. The deuterium passivation process of the present invention effectively passivates the trap sites, making them immune to hot carrier injection effects, and therefore finds a broad application within the semiconductor manufacturing industry.

Figure 1:
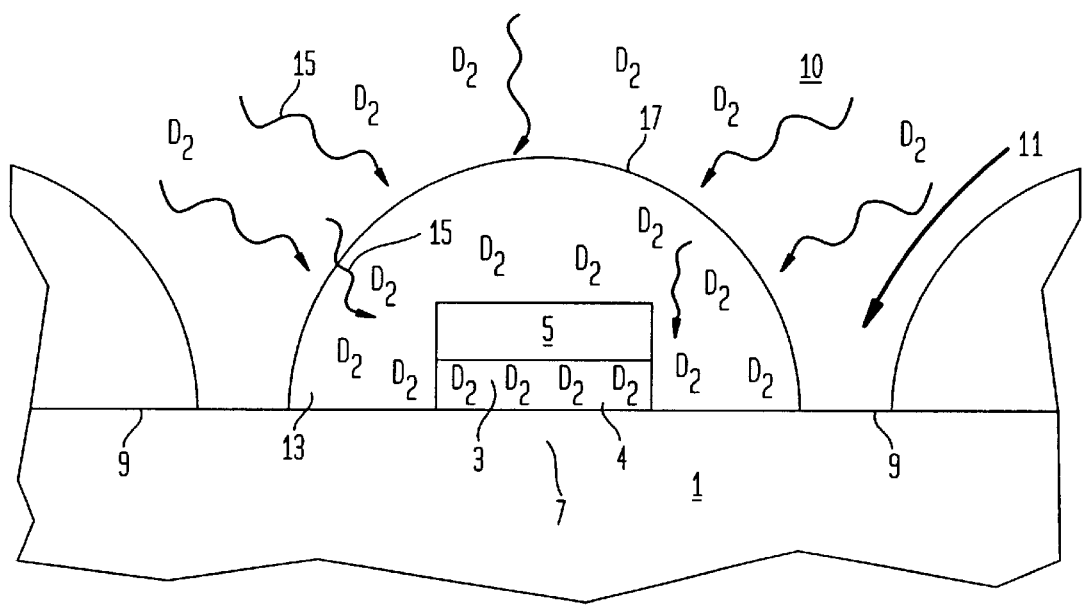
FIG. 1 is a cross-sectional view showing the gate dielectric structure and the initial passivation anneal process operation.

FIG. 1 is a cross-sectional view showing an exemplary embodiment of a structure being subjected to the first processing operation within the process sequence of the present invention. In FIG. 1, gate dielectric film 3 is formed over surface 9 of semiconductor substrate 1. In the preferred embodiment, semiconductor substrate 1 may be a silicon wafer commonly used in the semiconductor manufacturing industry. In the preferred embodiment, gate dielectric film 3 may be a thermally grown oxide film. In alternative embodiments, however, the gate dielectric film 3 may be formed by other means common in the semiconductor manufacturing industry. In the exemplary embodiment, gate dielectric film 3 is formed over channel region 7 of semiconductor substrate 1, the region which will ultimately form a channel for a transistor device (not shown). For an MOS transistor device formed within semiconductor substrate 1, source and drain regions will be subsequently formed lateral to channel region 7 within semiconductor substrate 1.

Interface region 4 is the portion of gate dielectric film 3 (hereinafter referred to as gate oxide film 3, as in the preferred embodiment) closest to surface 9 of semiconductor substrate 1. Interface region 4 is, generally speaking, a transition region between the amorphous oxide film 3 and the crystalline substrate 1. Trap sites are formed within oxide film 3, and especially within interface region 4, upon formation of the oxide film. Trap sites may also be produced in response to processing operations subsequent to the initial formation of the film. Trap sites include impurities, incomplete bonds, dangling bonds and broken bonds in the oxide film 3 and within the interface region 4. The present invention is directed to passivating these trap sites by complexing them with deuterium, so that trap sites are not available to be occupied by hot carriers which increases the charges trapped within the oxide film and can, in time, degrade device functionality.

Disposed above gate oxide film 3 is gate electrode 5. In the preferred embodiment, gate electrode 5 may be formed of a polysilicon film. Conventional methods for forming a polysilicon film on a substrate, then patterning the film to form a gate electrode, are common in the art. Any suitable method may be used. Disposed above and lateral to the gate structure, is dielectric film 13. In the preferred embodiment, dielectric film 13 is a relatively thick (8,000 to 12,000 angstroms) undoped oxide film formed using plasma enhanced chemical vapor deposition (PECVD), or low pressure chemical vapor deposition (LPCVD) means. In alternative embodiments, other dielectric films may be used. Alternative means for forming dielectric film 13 over the substrate are common in the art, and any suitable method may be used. Upon formation, dielectric film 13 comprises a continuous film formed to cover all exposed surfaces of the substrate 1.

Contact holes 11 may be formed through dielectric film 13 for the purpose of providing contact to surface 9 of silicon substrate 1. Conventional means for forming contact holes 11 include forming a photosensitive film (not shown) over dielectric film 13, forming a pattern within the photosensitive film, then using the patterned photosensitive film as a mask to form a pattern within the dielectric film by means of plasma, or other etching techniques. Although contact holes 11 are shown in the exemplary embodiment, it is not significant that contact areas have been formed prior to the process of the present invention. Dielectric film 13 includes an outer, or leading surface 17.

The processing operation as shown in FIG. 1, is performed subsequent to any high temperature (800° C. to 1000° C.) source/drain anneal operations which may have been carried out on the device. FIG. 1 shows the initial processing operation in the passivation anneal process being carried out. Deuterium environment 10 includes deuterium gas and in an alternative embodiment may additionally include nitrogen gas mixed with the deuterium gas. In FIG. 1, deuterium passivation is carried out by heating at a temperature within the range of 400° C. to 700° C., for a time ranging from 30 minutes to 4 hours. In the preferred embodiment, an annealing temperature of greater than 450° C. may be used. Arrows 15 represent the diffusion path of deuterium molecules into and within the structure. The deuterium molecules first penetrate outer surface 17 of dielectric film 13, then diffuse within the formed structure to passivate trap sites within dielectric film 13 as well as gate oxide film 3 including sites in interface region 4. The presence of deuterium complexing with and thereby passivating trap sites is indicated by the symbol "$D_2$".

The interrelated parameters of time, temperature and concentration of the deuterium within the deuterium environment, are chosen to allow complete diffusion of the deuterium from the environment, and into and throughout the device, so that trap sites formed within oxide film 3 and interface region 4 may be passivated by the deuterium. The conditions are further chosen to ensure that the concentration of deuterium within deuterium environment 10 urges the diffusion of deuterium into and throughout the device. A sufficiently long annealing time is chosen based upon other processing conditions, to insure that many of the dangling, incomplete, or broken bonds and impurities which form trap sites within gate oxide film 3 and interface region 4, have been complexed by deuterium. As such, the trap sites are no longer unoccupied; rather, they are occupied by deuterium.

Figure 2:
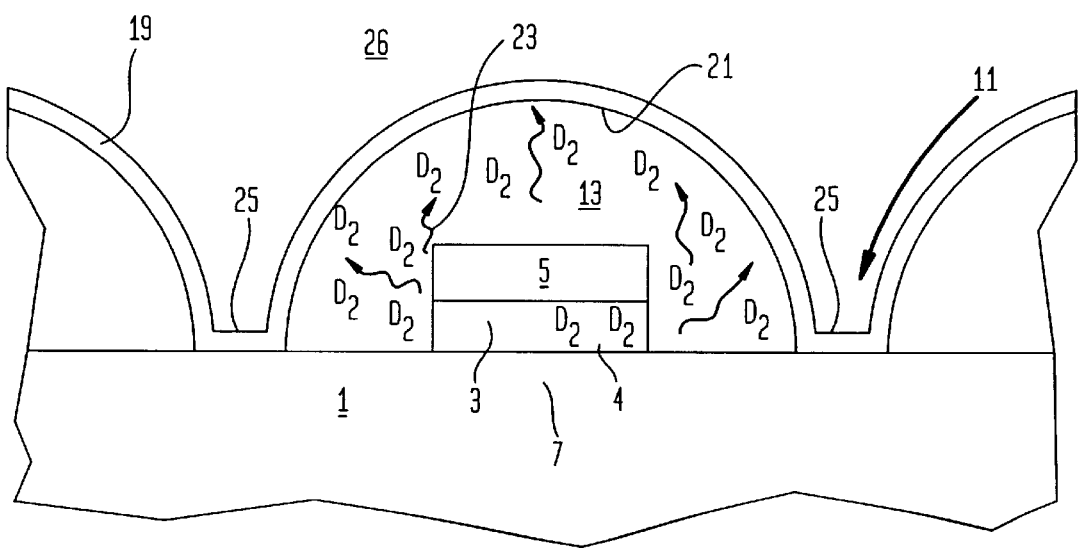
FIG. 2 is a cross-sectional view showing the gate dielectric structure after a barrier film has been formed and sintered.

Now turning to FIG. 2, barrier layer 19 has been added to the structure shown in FIG. 1. Barrier layer 19 is formed throughout the semiconductor device, and covers outer surface 17 of dielectric film 13. In the preferred embodiment, barrier layer 19 will additionally cover regions of substrate surface 9 exposed through contact holes 11. Conventional methods may be used to form the barrier film. These methods include sputter deposition, evaporation, and chemical vapor deposition. In the preferred embodiment, sputtering may be used. Barrier layer 19 may consist of a composite film of titanium/titanium nitride in an exemplary embodiment. In a preferred embodiment, a titanium nitride film is formed over a titanium film to form barrier layer 19. In alternative embodiments, tungsten, tungsten nitride, tantalum, and tantalum nitride may be formed as an individual film, or the films may be combined to form a composite film to form barrier layer 19. Barrier layer 19 is chosen to be impervious to deuterium diffusion. It can be seen that barrier layer 19 encapsulates at least gate oxide film 3. In the exemplary embodiment, barrier layer 19 encapsulates gate oxide film 3 including interface region 4, dielectric film 13, and polysilicon gate electrode 5.

After the barrier film has been formed, the sintering process shown in is FIG. 2 takes place. The sintering process allows for the barrier film to combine with silicon in regions where the two materials are exposed to each other, as seen in contact region 25. The sintering process may be carried out using any suitable gas, and in the preferred embodiment may include nitrogen and/or hydrogen. The sintering temperature will preferably be around 700° C., but higher temperatures may be used in alternative embodiments. This high temperature processing causes a redistribution of the deuterium encapsulated beneath the barrier layer. Although the redistribution of the deuterium within the encapsulated structure is somewhat random, the encapsulated deuterium may preferentially complex with the underside 21 of the barrier film 19 which can act as a sink for the deuterium molecules. If not for the encapsulating barrier material 19, some of the deuterium would diffuse out of the structure and into the environment 26. Arrows 23 generally represent the direction of diffusion of deuterium molecules within the structure and towards potential sink 21 of barrier material 19. The diffusion of deuterium molecules towards barrier material 19 comes at the expense of deuterium-passivated sites in gate oxide 3 and interface region 4. It can be seen, however, that no deuterium is lost from the encapsulated region because of the presence of the barrier film 19 which is impervious to deuterium.

After this processing step has occurred, there may be less deuterium present in gate oxide film 3, as shown in FIG. 2. In effect, a number of trap sites within gate oxide film 3 and interface region 4 may have become "de-passivated" by the re-distribution which occurs during the high temperature sintering process. If left in this condition, subsequently injected hot carriers could become trapped within the "de-passivated" trap sites and add to the oxide fixed charge. As such, the present invention provides for re-passivating the trap sites which became de-passivated due to the sintering process.

The sintering process described in conjunction with FIG. 2, may be carried out using a furnace operation conventionally used in the semiconductor manufacturing industry, or it may be alternatively carried out using an RTA process—rapid thermal annealing. Since the rapid thermal annealing process is an intense, short process operation, the resulting structure is less ordered, and the redistribution of deuterium within the encapsulated region is more random using this technique.

Figure 3:
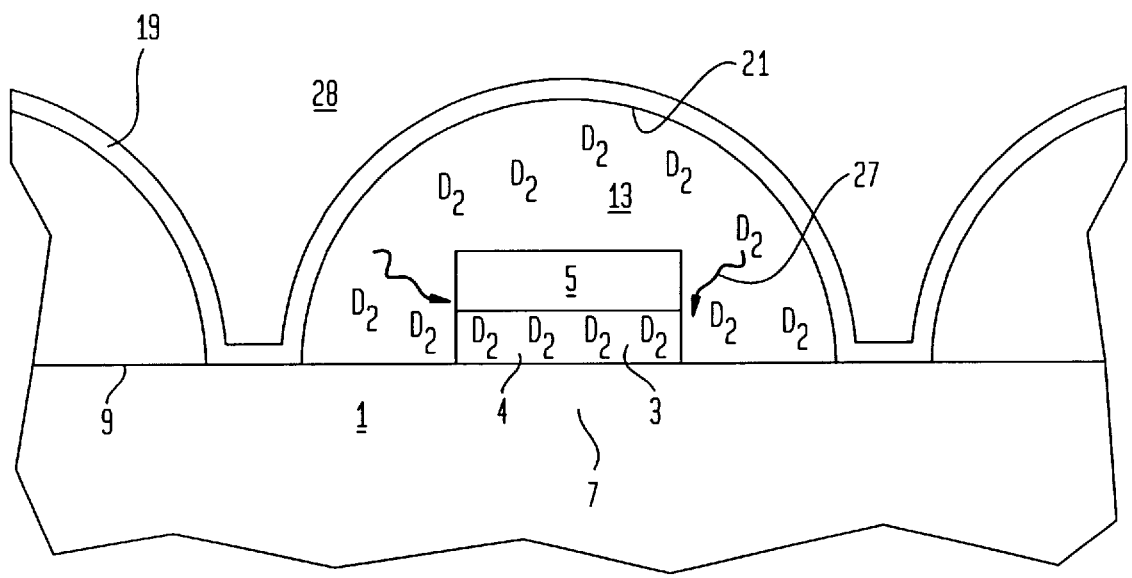
FIG. 3 is a cross-sectional view showing the structure and the second "re-passivation" processing operation.

After the high temperature sintering process, a re-passivation annealing process shown in FIG. 3 is carried out to restore $D_2$ passivation of trap sites within gate oxide film 3, including interface region 4. To regain $D_2$ passivation, an RTA or furnace anneal process is performed at a temperature below the temperature of the sintering process. In the preferred embodiment, the temperature of the re-passivation process may further be below the temperature of the initial $D_2$ passivation anneal step as carried out and described in conjunction with FIG. 1. In the preferred embodiment, annealing gas 28 may be nitrogen. In alternate embodiments, hydrogen or deuterium may additionally be used.

The re-passivation process may be carried out in a conventional processing furnace, or using RTA techniques. In the preferred process sequence, the re-passivation process may be carried out in-situ with respect to the sintering process described in conjunction with FIG. 2. According to this preferred, in-situ sequence, after the high temperature sintering process described in conjunction with FIG. 2, is carried out, process conditions may be varied and the substrate may continue to undergo processing without being removed from the furnace or RTA unit used to perform the high temperature sintering process. In an alternate embodiment, the re-passivation may constitute a separate process operation performed in a different processing unit.

With respect to RTA processing, the re-passivation annealing time may range from 30 seconds to 5 minutes, most preferably 1 minute in the preferred embodiment. With respect to furnace processing, the re-passivation annealing time may range from 30 minutes to 60 minutes. The re-passivation annealing temperature may range from 400° C. to 500° C., but will be significantly less than the temperature used in the sintering operation. In the preferred embodiment, the re-passivation annealing process temperature will be equal to or less than the annealing temperature used in the initial passivation step as described in conjunction with FIG. 1.

The second annealing, or re-passivation process urges the diffusion (as shown by arrows 27) of deuterium within the encapsulated structure to produce a more uniform distribution of deuterium within the encapsulated structure. As a result of this process, a significant amount of the trap sites within gate dielectric film 3, and specifically within interface region 4, will once again be complexed by deuterium molecules represented by molecular symbol $D_2$. It can be seen that the barrier film, which is impervious to the deuterium molecules, prevents any deuterium molecules from diffusing out of the encapsulated structure during the re-passivation process.

Figure 4:
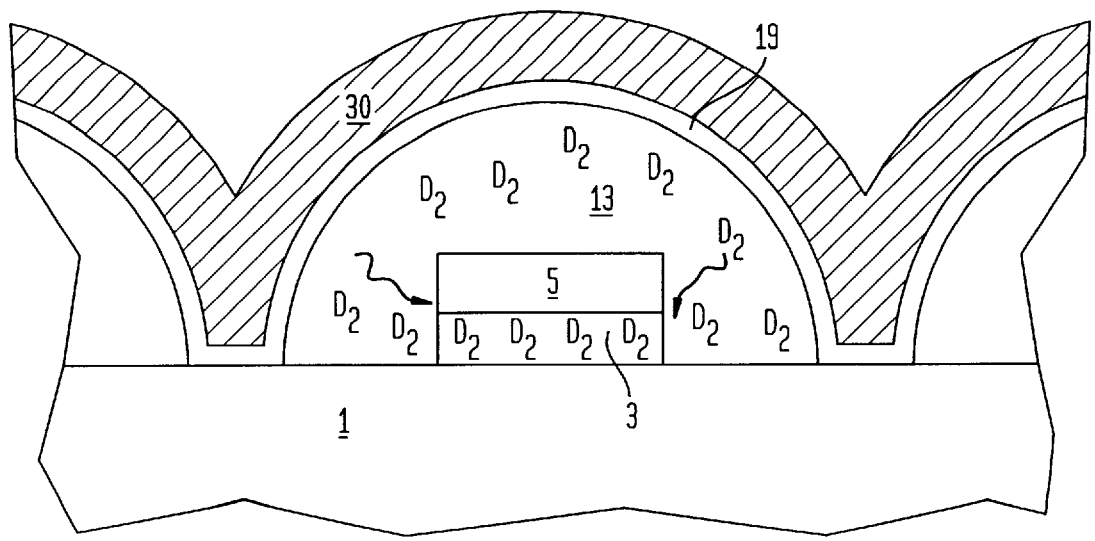
FIG. 4 is a cross-sectional view showing the structure after a metal film has been added.

It can be further seen that the process sequence of the present invention is carried out prior to the introduction of a metal film onto the semiconductor device. FIG. 4 shows a metal film 30 formed on the device after the passivation process sequence of the present invention. Since the deuterium molecules are encapsulated within the structure and beneath the barrier material, and since the introduction of the metal film precludes the subsequent use of processing steps utilizing temperatures greater than 400° C. to 450° C., it can be seen that the sites passivated with deuterium will remain passivated with the deuterium molecules. As such, the structure will remain resistant or immune to hot carrier aging effects. Therefore, the passivation anneal process which is commonly performed after a semiconductor integrated circuit device has been completely manufactured, may not be required to passivate the encapsulated sites.

The preceding description merely illustrates the principles of the invention. It will thus be appreciated that those skilled in the art will be able to devise various arrangement which, although not explicitly described or shown herein, embody the principals of the invention and are included within its scope and spirit. For example, the present invention may be used to provide deuterium passivation to any oxide film used in the formation of a semiconductor device, and is not intended to be limited to the gate oxide film structure shown in the figures. As another example, after the barrier material encapsulates the deuterium, alternative processing techniques may be used subsequently. Furthermore, all examples and conditional language recited herein are principally intended to be expressly for pedagogical purposes to aid the reader in understanding the principals of the invention and the concepts contributed by the inventors to furthering the art, and are to be construed as being without limitation to such specifically recited examples and conditions.

Moreover, all statements herein reciting principles, aspects, and embodiments of the invention, as well as specific examples thereof, are intended to encompass both structure and functional equivalents thereof. Additionally, it is intended that such equivalents include both currently known as well as equivalents developed in the future, i.e., any elements developed that perform the same function, regardless of structure. As such, the invention is not intended to be limited to the details shown. Rather, various modifications and additions may be made to details within the scope and range of equivalents of the claims and without departing from the invention. For example, additional details such as the processing times and conditions, may be varied and also remain within the scope and spirit of the present invention.

Accordingly, it is intended by the appended claims to cover all such modifications and changes as far within the true spirit and scope of the invention.

What is claimed:

1. A process for passivating traps within a semiconductor structure of a semiconductor device, comprising the steps of:
   (a) providing a semiconductor structure comprising a semiconductor substrate including a surface having an oxide film formed thereon;
   (b) after step (a), annealing the structure in an environment including deuterium;
   (c) after step (b), forming a barrier film over at least the oxide film, the barrier film at least indirectly encapsulating the oxide film and being impervious to deuterium, the barrier film chosen from the group consisting of titanium, titanium nitride, tungsten, tungsten nitride, tantalum, and tantalum nitride,
   (d) after step (c), sintering at a sintering temperature greater than about 700° C., and
   (e) after step (d), further annealing the structure at a further anneal temperature being less than the sintering temperature.

2. A process for passivating traps within a semiconductor structure of a semiconductor device, comprising the steps of:
   (a) providing a semiconductor structure comprising a semiconductor substrate including a surface having an oxide film formed thereon;
   (b) after step (a), annealing the structure in an environment including deuterium at a passivation anneal temperature within the range of 400° C. to 700° C.;
   (c) after step (b), forming a barrier film over at least the oxide film, the barrier film at least indirectly encapsulating the oxide film and being impervious to deuterium, the barrier film chosen from the group consisting of titanium, titanium nitride, tungsten, tungsten nitride, tantalum, and tantalum nitride,
   (d) after step (c), sintering at a sintering temperature greater than about 700° C., and
   (e) after step (d), further annealing the structure at a further anneal temperature being less than the sintering temperature.

3. The process as in claim 1, further comprising step (a1): after step (a), forming a polysilicon gate structure over the oxide film.

4. The process as in claim 3, further comprising step (a2): after step (a1), forming a dielectric film over at least the polysilicon gate structure, and in which step (c) includes the barrier film encapsulating the oxide film, the polysilicon gate structure, and the dielectric film.

5. The process as in claim 1, wherein the semiconductor substrate comprises a silicon substrate.

6. The process as in claim 1, wherein step (d) comprises rapid thermal annealing.

7. The process as in claim 1, in which step (b) includes annealing for a passivation anneal time sufficient to cause at least some of the deuterium to complex with a plurality of traps formed within the oxide film.

8. The process as in claim 7, wherein the traps comprise at least one of impurities and incomplete bonds.

9. The process as in claim 1, in which step (b) includes annealing for a passivation anneal time within the range of 30 minutes to 4 hours.

10. The process as in claim 1, wherein step (e) comprises rapid thermal annealing.

11. The process as in claim 1, in which step (e) includes further annealing for a time of 30 minutes or more.

12. The process as in claim 1, wherein the environment further includes nitrogen.

13. The process as in claim 1, wherein the annealing is carried out at a passivation anneal temperature being greater than or equal to the further anneal temperature.

14. The process as in claim 1, in which step (e) includes further annealing at a further anneal temperature within the range of 450° C. to 550° C.

15. The process as in claim 1, further comprising step (f): after step (e), forming a metal wiring pattern on the device.

16. The process as in claim 1, wherein the oxide film includes a plurality of traps therein, and further comprising steps:
   (f) after step (e), forming a metal wiring pattern on the device; and
   (g) after step (f), completing the formation of the semiconductor device,
      wherein a majority of traps of the plurality of traps are substantially passivated in steps (b) and (e).

17. The process as in claim 16, wherein the semiconductor device comprises an integrated circuit.

18. The process as in claim 1, further comprising, after the step a) of providing a semiconductor structure, the steps of:
   (a1) forming a polysilicon gate structure over the oxide film; and
   (a2) after step (a1), forming a dielectric film over at least the polysilicon gate structure, the barrier film encapsulating the oxide film, the polysilicon gate structure, and the dielectric film, and
      wherein step (b) urges at least some of the deuterium to complex with traps of a plurality of traps formed within the oxide film.

19. The process as in claim 18, wherein the barrier film includes a further plurality of traps on an inner surface thereof, step (d) urges a plurality of the at least some of the deuterium to complex with traps of the further plurality of traps, and step (e) urges a majority of the plurality of the at least some of the deuterium to complex with traps of the plurality of traps.

20. The process as in claim 1, wherein the steps (d) and (e) are carried out in-situ.

21. The process as in claim 1, wherein the semiconductor device includes a channel region formed within the surface, the oxide film formed on the surface being conterminous with the channel region.

* * * * *